United States Patent
Maeda (10) Patent No.: US 6,514,884 B2
(45) Date of Patent: *Feb. 4, 2003

(54) METHOD FOR REFORMING BASE SURFACE, METHOD FOR MANUFACTURING SEMICONDUCTOR DEVICE AND EQUIPMENT FOR MANUFACTURING THE SAME

(75) Inventor: Kazuo Maeda, Kamakura (JP)

(73) Assignee: Semiconductor Process Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,744

(22) Filed: May 13, 1998

(65) Prior Publication Data

US 2001/0012699 A1 Aug. 9, 2001

(30) Foreign Application Priority Data

Feb. 6, 1998 (JP) .............................. 10-026265

(51) Int. Cl.$^7$ ......................... H01L 21/31; H01L 21/469
(52) U.S. Cl. ......................... 438/787; 438/778; 427/99
(58) Field of Search ............................. 438/761, 784, 438/778, 787, 789, 790, 477, 494, 498, 504, 706, 906, 974; 427/532, 96, 97, 99

(56) References Cited

U.S. PATENT DOCUMENTS

| | | | | |
|---|---|---|---|---|
| 3,931,067 A | * | 1/1976 | Goldberg et al. ........ 260/2.5 M |
| 3,942,982 A | * | 3/1976 | Yanazawa et al. ............. 96/36 |
| 5,080,933 A | | 1/1992 | Grupen-Shemansky et al. . 117/93 |
| 5,365,877 A | | 11/1994 | Kubota .................. 427/256.28 |
| 5,376,591 A | | 12/1994 | Maeda et al. ............... 437/238 |
| 5,387,546 A | | 2/1995 | Maeda et al. ............... 437/174 |
| 5,479,727 A | * | 1/1996 | Fine et al. ..................... 34/516 |
| 5,484,749 A | * | 1/1996 | Maeda et al. ............... 437/238 |
| 5,508,540 A | * | 4/1996 | Ikeda et al. ................. 257/298 |
| 5,723,909 A | * | 3/1998 | Yano et al. .................. 257/760 |
| 5,807,785 A | * | 9/1998 | Ravi .......................... 438/624 |

FOREIGN PATENT DOCUMENTS

| | | |
|---|---|---|
| GB | 1044041 | 9/1966 |
| JP | 574747 | 3/1993 |
| JP | 590249 | 4/1993 |
| JP | 7-66287 | * 8/1993 |
| JP | 6157019 | 6/1994 |
| JP | 9176825 | 7/1997 |

OTHER PUBLICATIONS

Merriam–Wesbster's Collegiate Dictionary (10$^{th}$ edition), p. 524.*
Michael et al, "Reactions of Chlorosilanes with Silica Surface", The Journal of Physical Chemistry, vol. 73, No. 7, Jul. 1969, pp. 2372–2378.*
Yanazawa et al, "Hydrophobic conversion of the chemical deposited silicon oxide surface", Japan J. Appl. Phys., Suppl. 2, Pt 1, 1974, pp. 753–756.*
Fujino et al, "Reaction Mechanism of TEOS and O3 atmospheric pressure CVD", VMIC conference, Jun. 1991, Eighth International IEEE, pp. 11–12.*
Lou, Jen–Chung et al "Dichlorosilane Effects on Low–Temperature Selective Silicon Epitaxy" Applied Physics Letters 58(Jan. 7, 1991).

* cited by examiner

*Primary Examiner*—Chandra Chaudhari
*Assistant Examiner*—Thanhha Pham
(74) *Attorney, Agent, or Firm*—Lorusso & Loud

(57) ABSTRACT

The present invention relates to a method for reforming a surface of a base layer before thin film deposition, wherein a base thermal $SiO_2$ film is exposed to a gas selected from the group consisting of $AX_4$, $AH_nCl_{4-n}$ and $AR_nX_{4-n}$, wherein A represents Si, Ge or Sn, X represents I, Br, F or Cl and R represents $C_mH_{2m+1}$, wherein "n" is 1, 2 or 3 and "m" is a natural number.

10 Claims, 10 Drawing Sheets

FIG. 3A (Hydrophilic surface)

FIG. 3B (Hydrophilic surface)

FIG. 4A $SiCl_4 + OH \rightarrow SiCl_3 + HCl \uparrow + O\cdot$

FIG. 4B $SiCl_3 + O\cdot \rightarrow SiOCl_2 \uparrow + Cl \downarrow$

FIG. 4E $SiCl_4 + H_2O \rightarrow SiOCl_2\uparrow + 2HCl + Cl\downarrow$

< Horizontal type furnace >

FIG. 7B

< Vertical type furnace >

METHOD FOR REFORMING BASE SURFACE, METHOD FOR MANUFACTURING SEMICONDUCTOR DEVICE AND EQUIPMENT FOR MANUFACTURING THE SAME

BACKGROUND OF THE INVENTION

1. Field of the Invention

The present invention relates to a method for reforming a base surface before thin film deposition, a method for manufacturing the semiconductor device and an equipment for manufacturing the same, and more particularly to the method for reforming the base surface before the thin film deposition, the method for manufacturing the semiconductor device and the equipment for manufacturing the same in the thin film deposition by CVD (Chemical Vapor deposition) method using $O_3$/TEOS (Tetraehylorthosilicate) system reaction gas (the gases containing $O_3$ and TEOS).

2. Description of the Prior Art

It is known that a property of the film formed on the base layer is greatly influenced by the surface condition of the base layer.

Especially, characteristics of CVD film deposited by the CVD method using an $O_3$/TEOS gas system for thin film deposition greatly depends upon the surface condition of the base layer. For example, the growth rate of the thin film is reduced remarkably and the deposited film becomes porous when the surface of the base layer is hydrophilic.

Therefore, the fluidity, the flatness, the embedding ability and the step-coverage of the film deposited on a surface of a base layer are lowered.

It is thought that such deposition irregularity is caused by an intermediate generated in the reaction of $O_3$ gas and TEOS gas which is a polymer with hydrophilicity, and it is shown that a film can not be deposited on the surface of the base layer when the surface of the base layer is hydrophilic.

Methods eliminating dependence on the surface of the base layer described above, include (1) a method of plasma processing using the gases such as $NH_3$, $H_2$ or the like, (2) a method using an insulating film formed using a low concentration of $O_3$ as the base layer, (3) a method using an insulating film formed by a plasma CVD method as the base layer, (4) a method processing the surface of the base layer, before the thin film deposition, with alcohol, or the like.

However, there are problems as described below in the above-mentioned methods. That is, (1) In the method of plasma processing, using gases such as $NH_3$, $H_2$ or the like, films having good embedding ability and step-coverage have not been formed, when depositing the film on very narrow regions such as via holes and contact holes. (2) In the method using the insulating film formed by a plasma CVD method as the base layer, it has been difficult to form the insulating film being used as the base layer on the very narrow regions such as the via holes and the contact holes. (3) Also in the method using the insulating film formed by the plasma CVD method as the base layer, it has been difficult to form the insulating film being used as the base layer on the very narrow regions such as the via holes and the contact holes. (4) In the method processing the surface of the base layer before the thin film deposition with alcohol, the effect of reform is poor in reproduction and, in addition, the effect of reform processing of the base surface can not be maintained.

SUMMARY OF THE INVENTION

The object of the invention is to provide a method for reforming a base surface before the thin film deposition, a method for manufacturing a semiconductor device and apparatus for manufacturing the same, capable of maintaining a reformed base layer surface, to improve the fluidity, the flatness, the embedding ability and the step-coverage of the film deposited on the surface of the base layer and, especially, to improve the embedding ability and the step-coverage of the film formed in the very narrow regions such as the via-holes and the contact holes of the base layer.

In the invention, reform of the surface of the base layer in a reaction chamber is performed with a gas containing a halogen, and subsequently, a thin film can be deposited on the reformed surface of the base layer.

According to experiments of the inventor of this application, it has been found that when reform of the surface of the base layer is performed by a gas containing a halogen element, the effect of reform of the base layer surface can be maintained for the long term as compared to the prior art, in addition, the fluidity, the flatness, the embedding ability and the step-coverage of the film formed on the reformed surface of the base layer can be improved.

Especially, the embedding ability and the step-coverage of the film formed in the via holes or the like can be improved, even though there are the very narrow-concave regions such as the via holes and the contact holes in the base layer.

Moreover, the fluidity, the flatness, the embedding ability and the step-coverage of the film formed on the surface of the base layer thereof can be improved, when reform of the surface of the base layer is performed while heating the base layer.

Especially, it was confirmed that the reformed effect can be further enhanced by heating the surface to a temperature of 100° C. or more while reforming the surface.

DESCRIPTION OF THE PREFERRED EMBODIMENT

Hereinafter, an embodiment of the invention will be described referring to the accompanying drawings.

Figure 5:
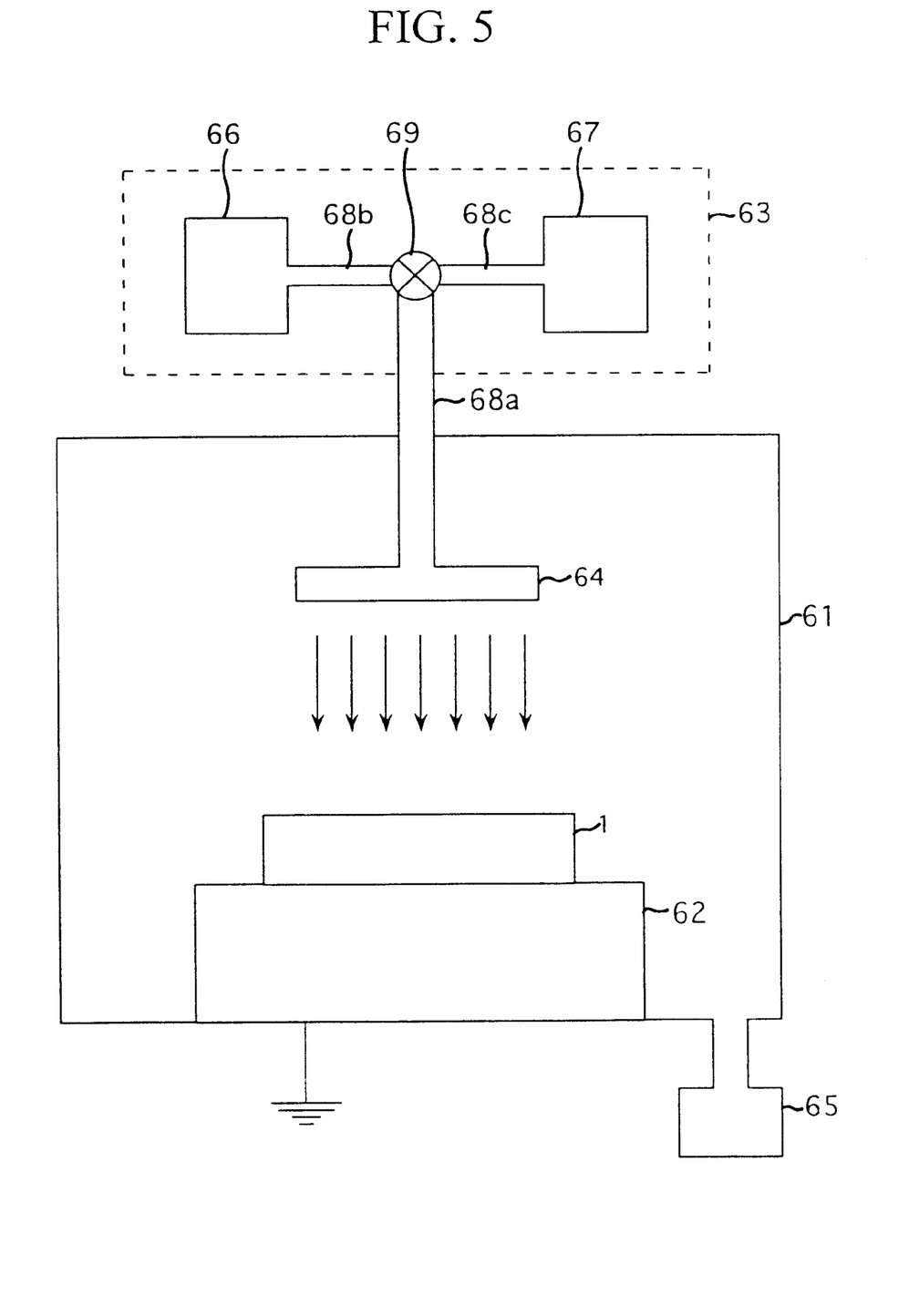
FIG. 5 is a schematic view showing CVD thin film deposition equipment of a cold wall system used in the method for reforming the base surface of the invention.

As seen in FIG. 5, a holding table 62 for holding a silicon wafer 1 is provided in a reaction chamber 61 (a chamber) made of stainless steel, and a heater (heating means) for heating the silicon wafer 1 is embedded in the holding table 62.

A conduit 68a introduces the $O_3$/TEOS gases (gases for thin film deposition) supplied from a gas supply means 63, or the gas for reforming the base layer surface, into the reaction chamber 61 and a gas distributor 64 discharges the $O_3$/TEOS gases, or the gas for reforming the base layer surface, onto the silicon wafer 1 on the holding table 62. The gas distributor 64 is connected to the distal end of the conduit 68a and is installed in the reaction chamber 61. Moreover, an exhaust device 65 for adjusting pressure in the reaction chamber 61 is connected to the reaction chamber 61.

The gas supply means 63 is comprised of a reforming gas supply means 66, a film-forming gas supply means for supply of the gas for thin film deposition 67, a conduit 68b and a selecting valve 69 (a selection means).

The reforming gas supply means 66 supplies the reforming gas to the reaction chamber 61 for reforming the base surface, and the film-forming gas supply means 67 supplies a gas mixture of $O_3$ and TEOS for thin film deposition after reforming the surface of the base layer.

The conduits 68b and 68c are connected to these two gas supply means 66 and 67 respectively, in addition, these conduits 68b and 68c are connected with the conduit 68a extending into the reaction chamber 61. These three conduits 68b, 68c and 68a connect to the selecting valve 69 which opens either the flow passage introducing the gas for reforming from the conduit 68b to the conduit 68a or opens the flow passage introducing the gas for thin film deposition from the conduit 68c to the conduit 68a.

Figure 6:
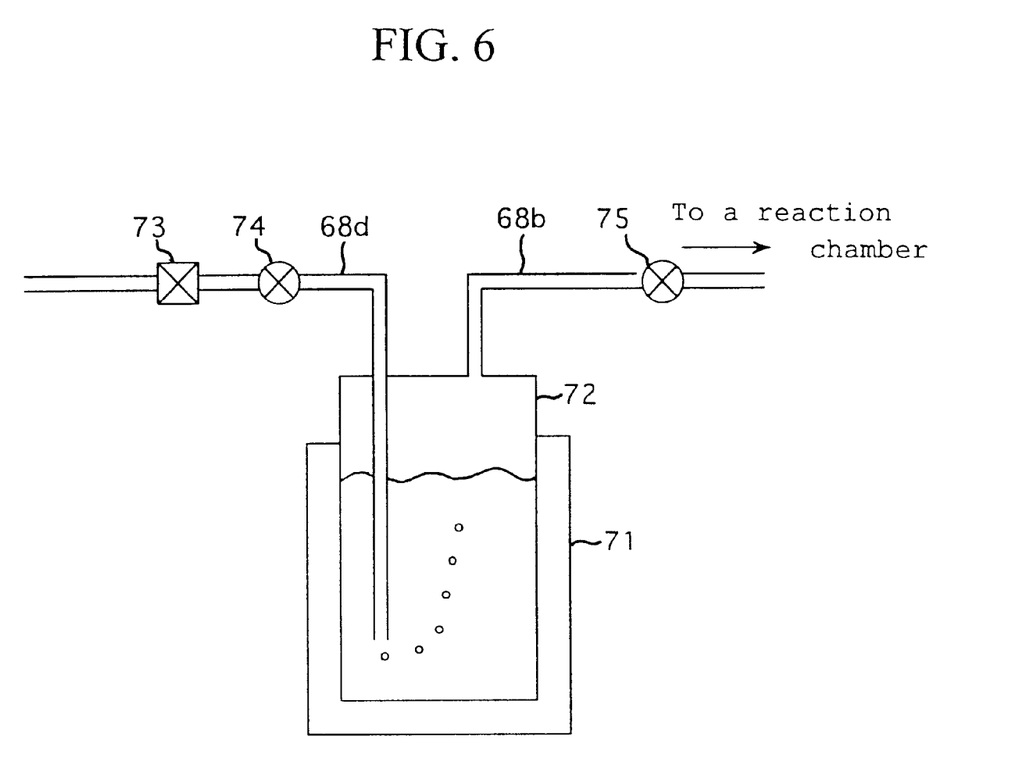
FIG. 6 is a side view showing a reforming gas supply means for manufacturing the semiconductor device according to the invention.

The detailed structure of the reforming gas supply means 66 is shown in FIG. 6 as including an evaporation container 72 in which liquid sources of gas such as liquid $SiCl_4$, $SiBr_4$, $SiF_4$ are accommodated and a temperature regulator 71 for adjusting the temperature of the liquid sources in the evaporation container 72, the temperature regulator being provided surrounding the evaporation container 72. Moreover, the reforming gas supply means 66 comprises the conduit 60d for introducing $N_2$, $H_2$ or Ar gas as carrier gas into the liquid sources in the reaction container 72 and the conduit 68b receives the reforming gas generated by bubbling the carrier gas through liquid sources. A flow meter 73 for measuring flow rate of $N_2$, $H_2$ or Ar gas and a valve 74 for flow regulation are provided in the conduit 68d and a valve 75 for flow regulation of the reforming gas is provided in the conduit 68b. The reforming gas generated in the evaporation container 72 is introduced into the reaction chamber 61 through the conduit 68b.

The method for reforming the base surface in accordance with an embodiment of the present invention will now be described with reference to FIGS. 1A to 1C, 2, 3 and 4A to 4E.

Figure 2:
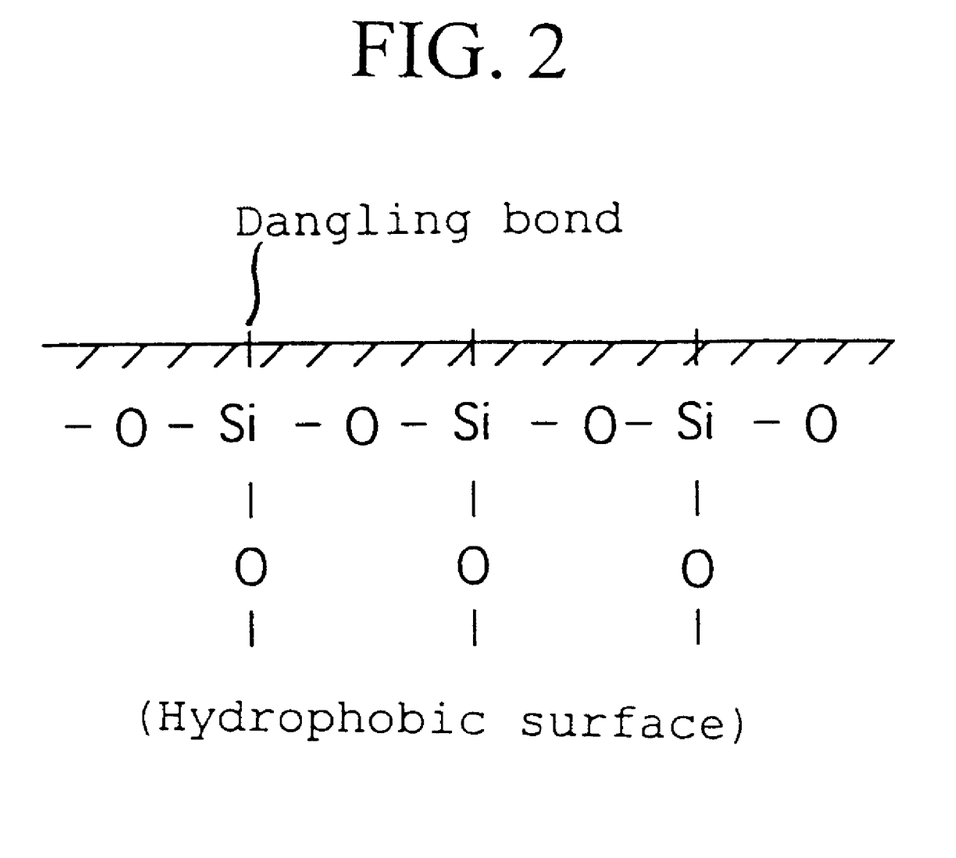
FIG. 2 is a view showing condition of a base thermal $SiO_2$ film surface soon after forming the base thermal $SiO_2$ film, according to the method for reforming the base surface of the invention.
Figure 3A:
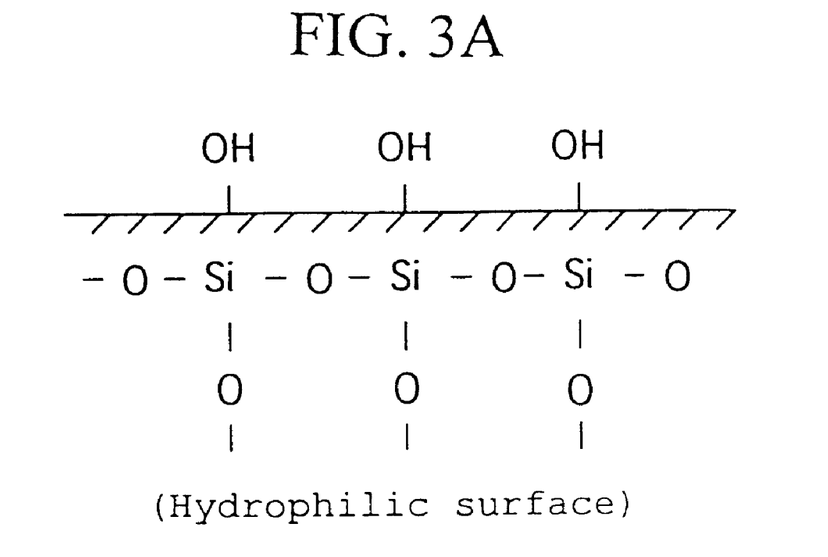
FIG. 3A and FIG. 3B are views showing condition of the base thermal $SiO_2$ film surface before reforming according to the method for reforming the base surface of the invention.
Figure 3B:
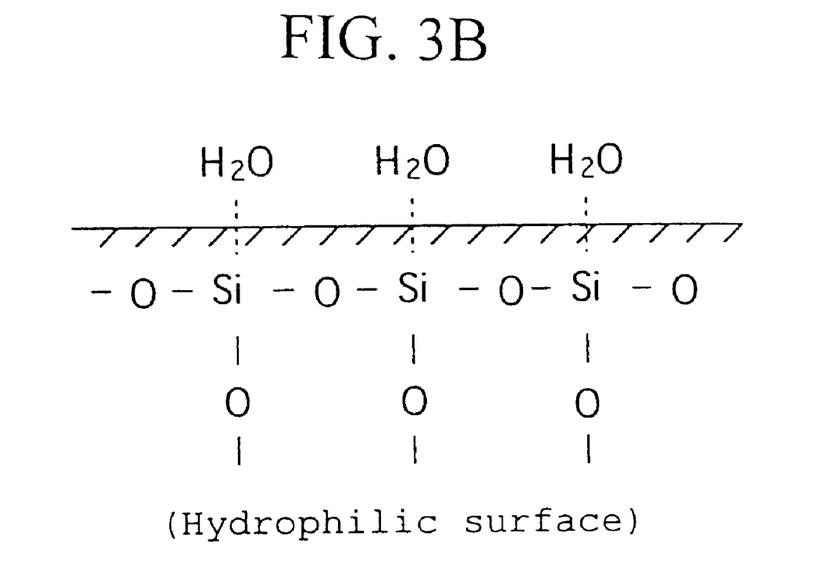

FIG. 2 illustrates the condition of a base thermal $SiO_2$ film surface soon after forming the thermal $SiO_2$ film as the base layer (hereinafter referred to as a base thermal $SiO_2$ film); FIG. 3A and FIG. 3B illustrate base thermal $SiO_2$ film surfaces before reforming; and FIG. 4A to FIG. 4E illustrate reactions of the base thermal $SiO_2$ film with the reforming gas $SiCl_4$ at the base thermal $SiO_2$ film surface.

Figure 1A:
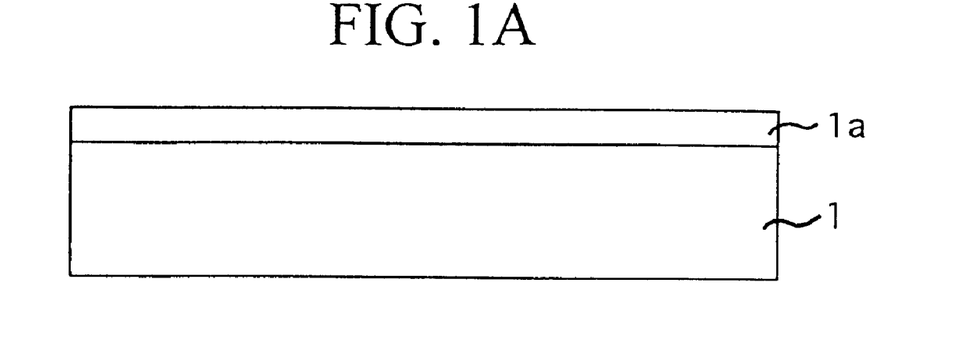
FIG. 1A to FIG. 1C are sectional views showing an embodiment of the method for reforming a base surface in accordance with the invention.

First, the silicon wafer 1 is fed in an oxidation furnace to be heated at 1100° C. within an oxygen atmosphere. By this treatment, the surface of the silicon wafer 1 is oxidized, whereby the thermal $SiO_2$ film 1a is formed as shown in FIG. 1A. This thermal $SiO_2$ film 1a becomes the base layer for thin film deposition. There are dangling Si bonds at the surface of a base thermal $SiO_2$ film 1a soon after being formed as shown in FIG. 2.

In this process, a plasma enhanced CVD method and a low pressure CVD method or the like may be used. At this point in time, it is believed that the surface of the base thermal $SiO_2$ film 1a, upon contact with air containing moisture, hydrates by bonding of Si and OH to form Si—OH bonds as shown in FIG. 3A, or by bonding Si and $H_2O$ to form Si—$H_2O$ bonds as shown in FIG. 3B. In any event, the base thermal $SiO_2$ film 1a becomes hydrophilic.

Figure 1B:
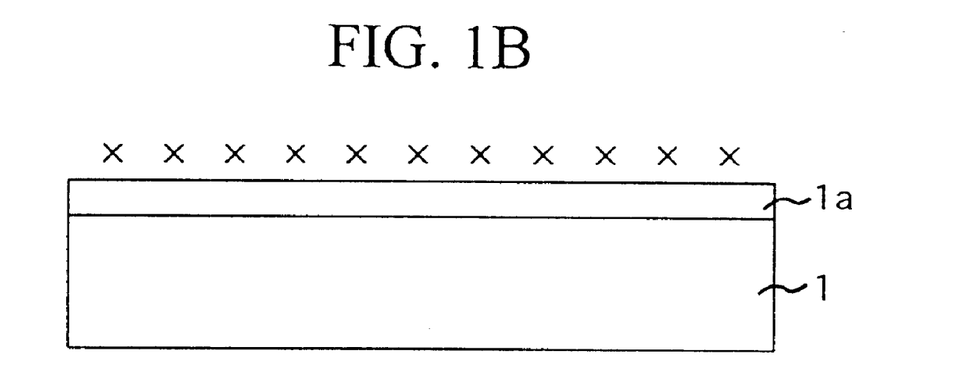

Subsequently, the silicon wafer 1 is placed on the holding table 62 in the reaction chamber 61 as shown in FIG. 1B and heated to 100° C. or more by the heater built in the holding table 62. Then, the gas for reforming the base layer surface containing $SiCl_4$ is supplied from the reforming gas supply means 66 to the reaction chamber 61. The gas for reforming the base layer surface is discharged onto the surface of the base thermal $SiO_2$ film 1a formed on the silicon wafer 1.

At this time, it is estimated that two kinds of reaction occur between the base thermal $SiO_2$ film 1a and the reforming gas, at the base layer surface. Each mark "x" in FIG. 1B represents a reaction site.

First, the reaction involving Si—OH bonds will be described.

Figure 4A:
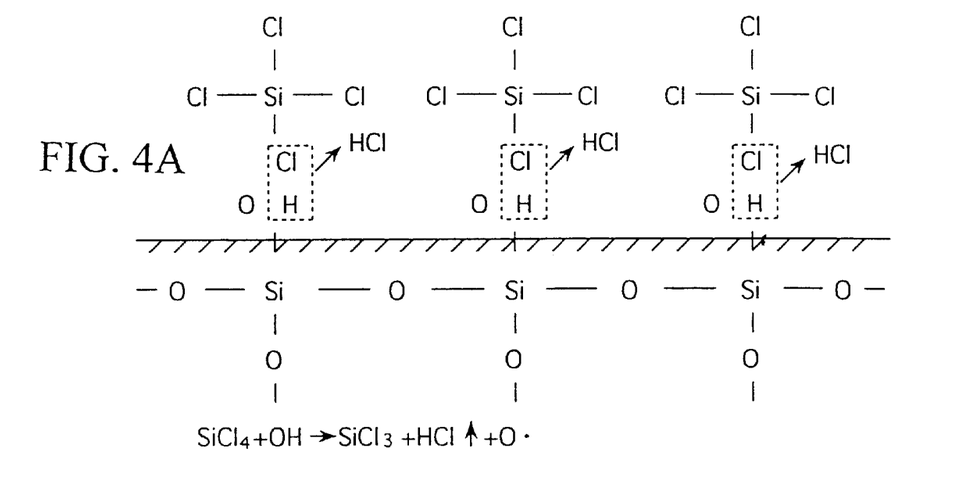
FIG. 4A to FIG. 4F are views showing a reaction of the base thermal $SiO_2$ film and gaseous $SiCl_4$ according to the method for reforming the base surface of the invention.

As shown in FIG. 4A, the —H in the Si—OH bond at the base layer surface and —Cl in the $SiCl_4$ gas react on the surface of the heated base thermal $SiO_2$ film to generate HCl. By this reaction, O remains bonded to the Si of the surface of the base thermal $SiO_2$ film 1a, and —Cl is removed from $SiCl_4$ to generate $SiCl_3$. Moreover, HCl generated is discharged away from the region of the surface of the base thermal $SiO_2$ film 1a, since the temperature of the surface of the base thermal $SiO_2$ film 1a is 100° C. or more.

$SiCl_4 + OH^- \rightarrow SiCl_3 + HCl + O^{2-}$

Oxygen and Si of the surface of the base thermal $SiO_2$ film 1a are bonded to form SiO.

Figure 4B:
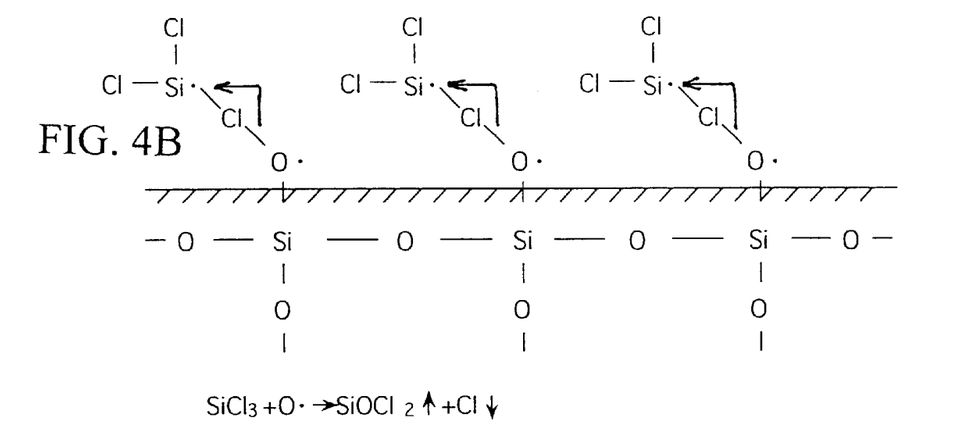
Figure 4C:
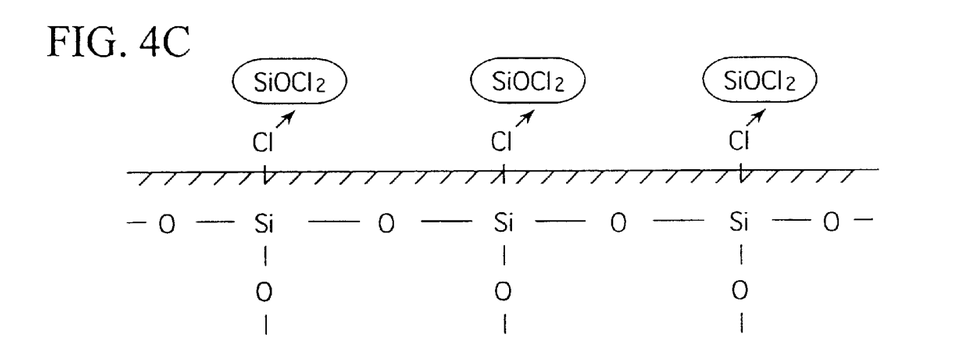

Subsequently, the $SiCl_3$ thus generated and the Si—O at the surface of the base thermal $SiO_2$ film 1a react as shown in FIG. 4B, whereby Cl and O substitute to form $SiOCl_2$ and Si—Cl surface bonds as shown in FIG. 4C.

$SiCl_3 + O^{2-} \rightarrow SiOCl_2 + Cl^-$

By this reaction, hydrophobicity is created, since the surface of the base thermal $SiO_2$ film 1a is halogenated.

Figure 4D:
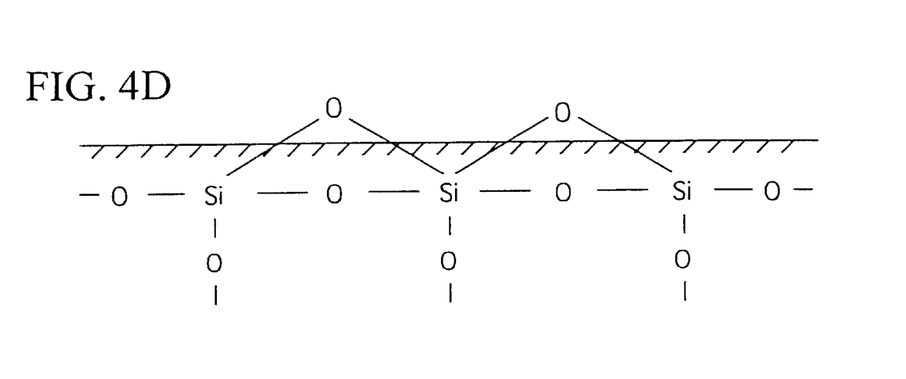

Hydrophobicity remains when the surface is oxidized as shown in FIG. 4D.

Figure 4E:
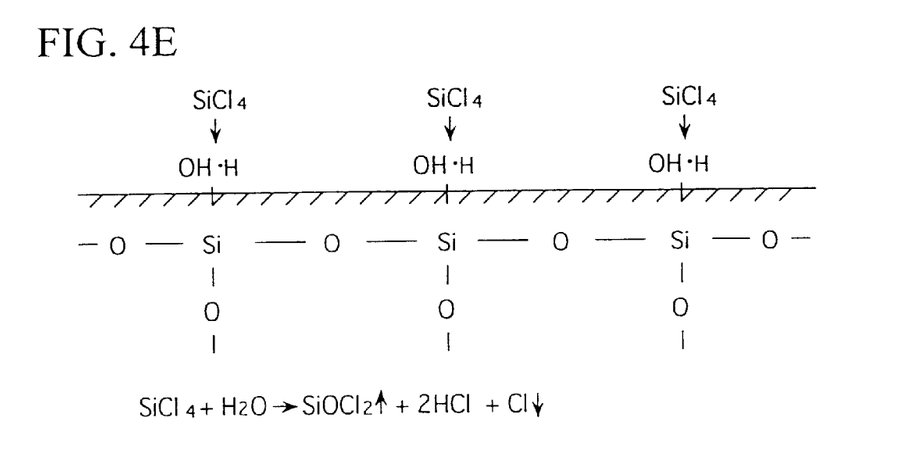

On the other hand, when Si at the surface of the base thermal $SiO_2$ film 1a is bonded with $H_2O$, $SiCl_4$ and $H_2O$ react as shown in FIG. 4E to generate $SiOCl_2$, HCl and Cl through the same reaction processes as described in FIG. 4A to FIG. 4D.

$SiCl_4 + H_2O \rightarrow SiOCl_2 + 2HCl + Cl^-$

Figure 4F:
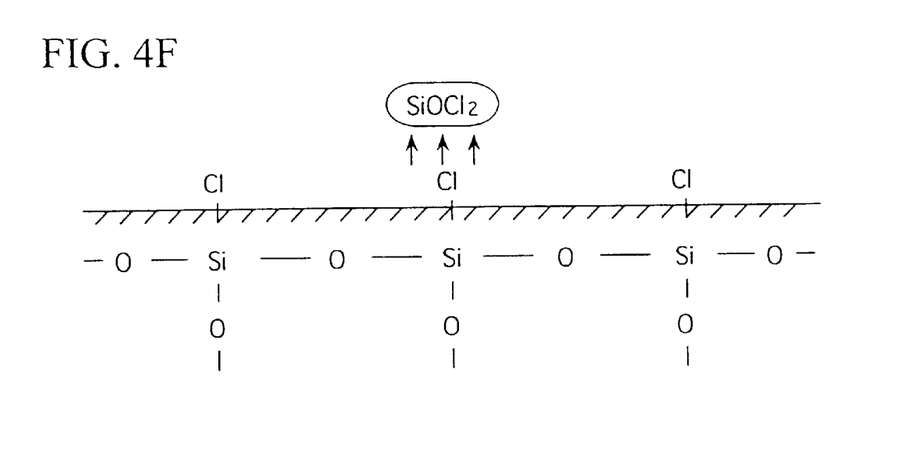

As a result, it is considered that since Si of the surface of the base thermal $SiO_2$ film 1a and Cl are bonded and the surface of the base thermal $SiO_2$ film 1a is thereby chlorinated as shown in FIG. 4F, hydrophobicity is created.

Figure 1C:
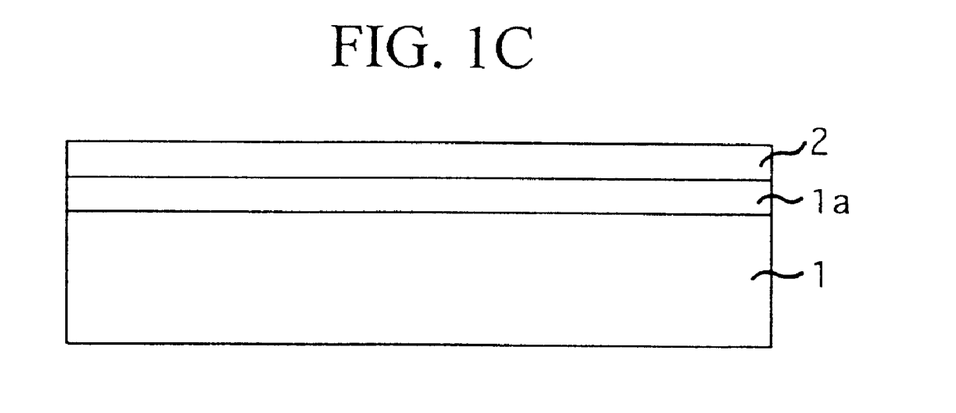

After the reforming process described above, without further processing such as cleaning the surface of the base thermal $SiO_2$ film 1a, the wafer can be transferred to a subsequent thin film deposition process. Therefore, the supply of reforming gas is stopped, and the mixed gas of the $O_3$ and TEOS is supplied into the reaction chamber 61 as the gas for thin film deposition from the supply means 67. Moreover, the silicon wafer 1 is heated at approximate 400° C. to react the $O_3$ and TEOS gases thermally. Holding these conditions for a given time period, an $O_3$/TEOS $SiO_2$ film 2 is formed on the base thermal $SiO_2$ film 1a as shown in FIG. 1. This $O_3$/TEOS $SiO_2$ film 2 shows the $SiO_2$ film formed by reaction of the $O_3$ gas and the TEOS gas.

In this embodiment, the thin film deposition is performed using the reactant gases after reforming the surface of the base thermal $SiO_2$ film 1a to render it hydrophobic, whereby the fluidity, the flatness, the embedding ability and the step-coverage of $O_3$/TEOS $SiO_2$ film 2 are improved.

Especially, the effect of the reforming is maintained by using the reforming gas containing a halogen element. That is, even though after reforming of the base surface, the surface of the base thermal $SiO_2$ film 1a is exposed to air for 24 hours, the fluidity, the flatness, the embedding ability and the step-coverage of the $O_3$/TEOS $SiO_2$ film 2 subsequently formed thereon can be maintained.

Hydrophobicity can be improved when the temperature of the surface of the base thermal $SiO_2$ film 1a is 100° C. or more. In this case, it is considered that silanol (here, $Si(OH)_4$ is applicable) is generated in the reforming process, and silanol is decomposed at a temperature of 100° C. or more. Moreover, when silanol is generated it takes a long time to decompose the silanol at less than 100° C., so that the time period of silanol remaining on the surface of the base thermal $SiO_2$ film 1a becomes long, whereby conversion from hydrophilicity to hydrophobicity becomes difficult.

Hereinafter, a working example will be described referring to FIG. 8. In this example, the invention is applied to a base layer in which there are grooves narrow in width. Moreover, for comparison, a comparison film deposited on the base layer without prior reforming in accordance with the invention is shown in FIG. 9.

Figure 8:
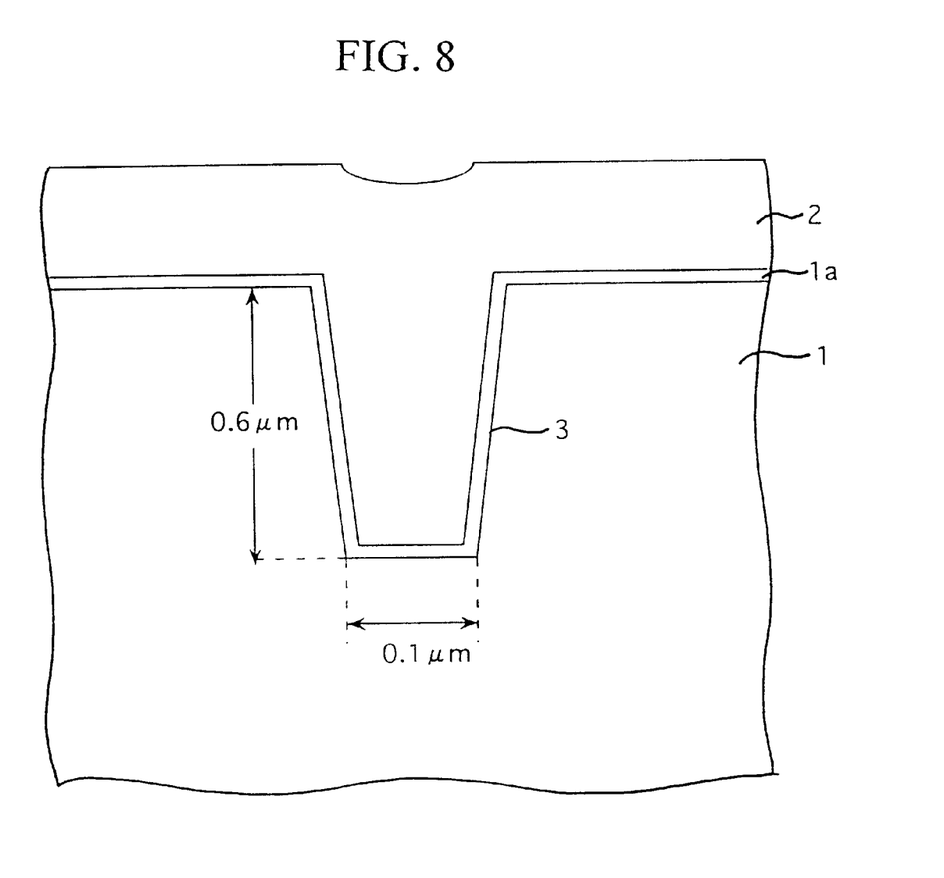
FIG. 8 is a sectional view of a $O_3$/TEOS $SiO_2$ film after reforming according to the invention.
Figure 9:
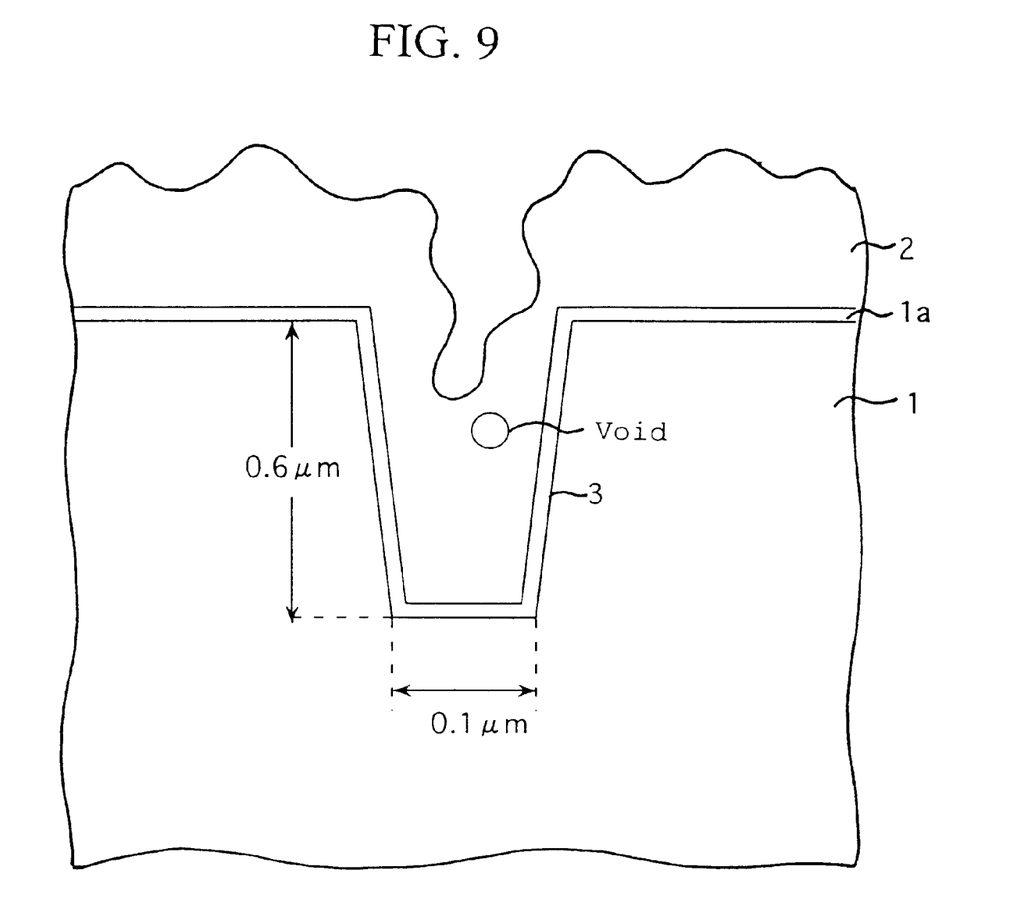
FIG. 9 is a sectional view of a $O_3$/TEOS $SiO_2$ film formed without reforming of the base surface, for comparison.

As shown in FIG. 8, a groove 3 approximately 0.1 μm in width and approximately 0.6 μm in depth was formed in the silicon wafer 1 and a thermal $SiO_2$ film 1a was formed on the surface of the silicon wafer 1 having this groove 3 to provide the base layer. Then, the $O_3$/TEOS $SiO_2$ film 2 was formed on the base layer surface, and it was then determined whether or not the embedding ability and the step-coverage of the $O_3$/TEOS $SiO_2$ film 2 subsequently formed could be improved.

The heating temperature was set at 1100° C. in forming the base thermal $SiO_2$ film 1a.

As the conditions for reforming of the base surface, liquid $SiCl_4$ at 20° C. was used as a gas source, and bubbling was performed for about 2 minutes by introducing $N_2$ gas into this $SiCl_4$ at the rate of 5 liters per min. Moreover, the heating temperature of the silicon wafer 1 was set at 250° C.

In the deposition of the $O_3$/TEOS $SiO_2$ film 2, the ozone concentration in the gas for thin film deposition composed of the mixed gas of $O_3$ and TEOS was set at a so-called "high concentration" of $O_3$ of 5 percent $O_3$ in $O_2$, and heating temperature of the silicon wafer 1 was set at 400° C.

As illustrated in FIG. 8 the $O_3$/TEOS $SiO_2$ film 2 has a surface which is planarized and is formed without voids, when the $O_3$/TEOS $SiO_2$ film 2 is formed after reforming the base surface in accordance with the present invention.

In contrast, it is found that voids form, the surface of the film 2 becomes wavy, and a planarized film can not be obtained, as shown in FIG. 9, when the $O_3$/TEOS $SiO_2$ film 2 is formed without reforming of the base surface.

As described above, the embedding ability and the step-coverage of the film 2 formed in the groove 3 can be improved, when the base layer 1a having the very narrow-concave regions such as the groove 3 is reformed with a gas containing a halogen.

In this embodiment, although the same chamber 61 is used, without dividing the reaction chamber, for reforming the base surface and for depositing the $O_3$/TEOS $SiO_2$ film 2, separate reaction chambers may be respectively used.

Moreover, the reaction chamber 61 may be a single wafer processing reaction chamber or a batch processing apparatus of the furnace type.

Figure 7A:
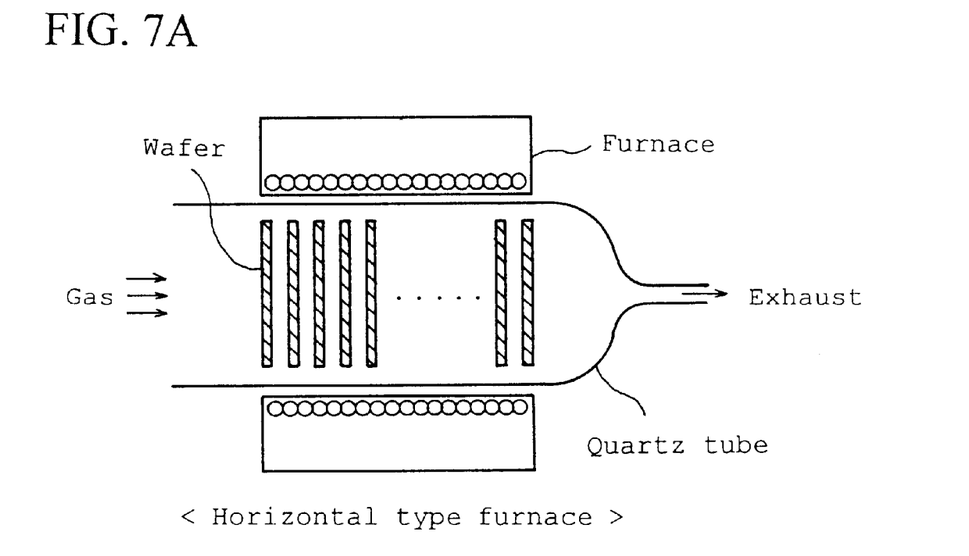
FIG. 7A and FIG. 7B are sectional views showing a reactor with a hot wall system for manufacturing the semiconductor device in accordance with the invention.
Figure 7B:
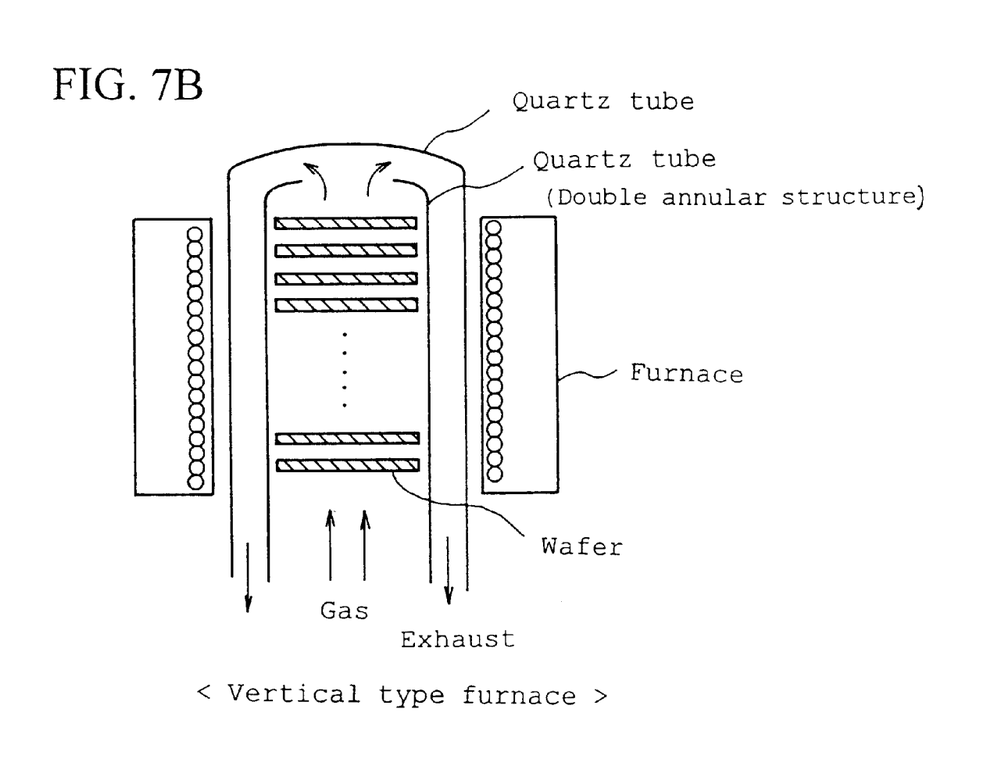

Furthermore, although a cold wall system is used in the above-described embodiment, a hot wall system as shown in FIG. 7 and a horizontal type furnace as shown in FIG. 7A or a vertical type furnace as shown in FIG. 7B may be used.

A heater, e.g. an infrared heater, provided in the vicinity of the reaction chamber can be used as the heating means of the hot wall system.

Although $SiCl_4$ is used as the gas represented by the general formula $AX_4$ in the reforming gas, another gas, for example, $SiI_4$, $SiBr_4$ or $SiF_4$, of the general formula $AX_4$ can be used. Furthermore, a gas, for example, $SiHCl_3$, $SiH_2Cl_2$ or $SiH_3Cl$, of the general formula $AH_nCl_{4-n}$ (wherein "n" is 1, 2 or 3) can be used. Moreover, a gas, for example, $Si(C_mH_{2m+1})Cl_3$, $Si(C_mH_{2m+1})_2Cl_2$, $Si(C_mH_{2m+1})_3Cl$, of the general formula $AR_nX_{4-n}$ (wherein "m" is a natural number) can be used.

Moreover, in the general formula described above, A represents any one of Si, Ge or Sn, X represents any one of I, Br, F or Cl and R represents any one of $C_mH_{2m+1}$.

Furthermore, although a $SiO_2$ film is used as the insulating film formed on the base layer, any one of PSG (Phosphosilicate glass) film, BSG (Borosilicate glass) film or BPSG (Borophosphosilicate glass) film can be used. A mixed gas of $O_3$ and TEOS and TMP (Trimehtylphosphite:P $(OCH_3)_3$) or TMOP (Trimehtylphosphite:$PO(OCH_3)_3$) for deposition of a thin PSG film, a mixed gas of $O_3$ and TEOS and TMB (Trimehtylborate:$B(OCH_3)_3$) for deposition of a thin BSG film, or a mixed gas of $O_3$ and TEOS and TMB and TMP or TMOP for deposition of a thin BPSG film can also be used.

As described above, according to the present invention, after the surface of the base layer is exposed to a gas containing a halogen for reforming the base layer surface, the thin film deposition is performed on the reformed surface of the base layer using the gas for thin film deposition.

The effect of reforming of the base layer surface can be maintained, since the gas used for reforming of the base layer surface contains a halogen. Micronization and the increase in density of the device can be also realized, since a film excellent in embedding ability and the step-coverage can be deposited on the surface of the base layer 1a having the regions narrow in width such as grooves.

What is claimed is:

1. A method for forming film on a base layer for a semiconductor device comprising:

(a) reforming a surface of the base layer by contacting the surface with a reforming gas containing an inorganic silicon halogen compound to halogenate the surface and to produce an exposed halogenated surface of the base layer at which halogen is bonded to Si;

(b) after said contacting of the surface with the reforming gas, contacting the exposed halogenated surface with a film-forming gas different from the reforming gas, said film-forming gas containing tetraethylorthosilicate and $O_3$; and (c) forming a film on said halogenated surface by chemical vapor deposition with reaction of the tetraethylorthosilicate with the $O_3$.

2. A method according to claim 1, wherein said inorganic silicon halogen compound is selected from the group consisting of $SiCl_4$, $SiI_4$, $SiBr_4$, $SiF_4$, $SiHCl_3$, $SiH_2Cl_2$ and $SiH_3Cl$.

3. A method according to claim 1, wherein said base layer has a concave region.

4. A method according to claim 3, wherein said base layer is heated at a temperature of at least 100° C.

5. A method according to claim 1, wherein said base layer is heated during said exposing to said gas.

6. A method according to claim 1, wherein said reforming of the surface and said film forming are performed in one and the same chamber, and, after completing said reforming, said film forming is performed without exposure of the base layer to an atmosphere outside of the one and the same chamber.

7. A method according to claim 1 wherein said inorganic silicon halogen compound is a silicon halide.

8. A method according to claim 1 wherein said surface of said base layer is a surface of a thermal $SiO_2$ film.

9. A method according to claim 1 wherein said base layer has a surface with dangling Si bonds rendered hydropilific by contact with moisture and wherein said reforming serves to bond halogen to Si through the dangling bonds at the surface to produce the exposed halogenated surface.

10. A method according to claim 1 wherein said inorganic silicon halogen compound is an inorganic silicon chlorine compound and wherein said surface is chlorinated.

* * * * *

UNITED STATES PATENT AND TRADEMARK OFFICE
CERTIFICATE OF CORRECTION

PATENT NO.     : 6,514,884 B2
DATED          : February 4, 2003
INVENTOR(S)    : Maeda It is certified that error appears in the above-identified patent and that said Letters Patent is hereby corrected as shown below:

Column 1,
Line 18, "Tetraehylorthosilicate" should read -- Tetraethylorthosilicate --.

Column 4,
Line 45, "$SiCl_4 + OH^- \rightarrow SlCl_3 + HCl + O^{2-}$" should read -- $SiCl_4 + OH^- \rightarrow SiCl_3 + HCl + O^{2-}$ --.

Column 8,
Line 10, "hydropilific" should read -- hydrophilic --.

Signed and Sealed this

Twenty-fourth Day of June, 2003

JAMES E. ROGAN
*Director of the United States Patent and Trademark Office*